(12) United States Patent
Hwang et al.

(10) Patent No.: US 9,313,883 B2
(45) Date of Patent: Apr. 12, 2016

(54) CONDUCTIVE SUBSTRATE AND TOUCH SCREEN HAVING SAME

(75) Inventors: Ji Young Hwang, Daejeon (KR); In-Seok Hwang, Daejeon (KR); Seung Heon Lee, Daejeon (KR); Sang Ki Chun, Daejeon (KR); Yong Goo Son, Daejeon (KR); Beom Mo Koo, Daejeon (KR); Jiehyun Seong, Daejeon (KR); Joo Yeon Kim, Daejeon (KR); Je Seob Park, Seoul (KR)

(73) Assignee: LG CHEM, LTD., Seoul (KR)

( * ) Notice: Subject to any disclaimer, the term of this patent is extended or adjusted under 35 U.S.C. 154(b) by 190 days.

(21) Appl. No.: 14/008,201

(22) PCT Filed: Mar. 28, 2012

(86) PCT No.: PCT/KR2012/002285
§ 371 (c)(1),
(2), (4) Date: Sep. 27, 2013

(87) PCT Pub. No.: WO2012/134175
PCT Pub. Date: Oct. 4, 2012

(65) Prior Publication Data
US 2014/0016047 A1    Jan. 16, 2014

(30) Foreign Application Priority Data
Mar. 28, 2011    (KR) .................. 10-2011-0027832

(51) Int. Cl.
*G02F 1/1335* (2006.01)
*H05K 1/02* (2006.01)
*G06F 3/041* (2006.01)
*G02F 1/1333* (2006.01)

(52) U.S. Cl.
CPC .......... *H05K 1/0274* (2013.01); *G02F 1/13338* (2013.01); *G06F 3/041* (2013.01)

(58) Field of Classification Search
CPC .... G06F 3/041; G02F 1/13338; H05K 1/0274
USPC ...................................... 349/12; 345/173–177
See application file for complete search history.

(56) References Cited

U.S. PATENT DOCUMENTS

| 8,087,175 | B2 * | 1/2012 | Kluge et al. ................ 30/346.51 |
| 8,822,865 | B2 * | 9/2014 | Hwang et al. ................. 200/600 |
| 8,878,101 | B2 * | 11/2014 | Choi et al. .................... 219/203 |
| 2009/0079919 | A1 | 3/2009 | Niioka et al. |
| 2010/0013785 | A1 | 1/2010 | Murai et al. |
| 2010/0013798 | A1 | 1/2010 | Nakajima et al. |

(Continued)

FOREIGN PATENT DOCUMENTS

| CN | 101411255 A | 4/2009 |
| CN | 101683022 A | 3/2010 |

(Continued)

*Primary Examiner* — Hoan C Nguyen
(74) *Attorney, Agent, or Firm* — Dentons US LLP

(57) ABSTRACT

The present invention relates to a conducting substrate and a touch screen comprising the same, and the conducting substrate according to the present invention comprises a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the number of vertexes of the closed figures is different from the number of vertexes of quadrangles having the same number as the closed figures.

20 Claims, 8 Drawing Sheets

(56) References Cited

U.S. PATENT DOCUMENTS

| | | | |
|---|---|---|---|
| 2010/0136288 A1 | 6/2010 | Tanaka et al. | |
| 2010/0147577 A1 | 6/2010 | Tanaka et al. | |
| 2011/0272394 A1* | 11/2011 | Chun et al. | 219/546 |
| 2011/0290631 A1* | 12/2011 | Kuriki | 200/600 |
| 2012/0187821 A1 | 7/2012 | Lee et al. | |
| 2013/0028503 A1* | 1/2013 | Wakui et al. | 382/141 |
| 2013/0248239 A1 | 9/2013 | Lee et al. | |

FOREIGN PATENT DOCUMENTS

| | | |
|---|---|---|
| JP | 11-150388 | 6/1999 |
| JP | 11-150388 A | 6/1999 |
| JP | 2002-014772 A | 1/2002 |
| JP | 2002-108248 A | 4/2002 |
| JP | 2003-195356 A | 7/2003 |
| JP | 2007-155871 A | 6/2007 |
| JP | 2009-080288 | 4/2009 |
| JP | 2009-80288 A | 4/2009 |
| JP | 2010027391 A | 2/2010 |
| KR | 1020100122315 A | 11/2010 |
| KR | 10-2011-0007593 A | 1/2011 |
| WO | 2008108042 A1 | 9/2008 |
| WO | 2011008055 A9 | 1/2011 |

* cited by examiner

| Randomness | Reflective diffraction | Moire image |
|---|---|---|
| 0 |  |  |
| 10% |  |  |
| 30% |  |  |
| 50% |  |  |
| 70% |  |  |
| 100% |  |  |

CONDUCTIVE SUBSTRATE AND TOUCH SCREEN HAVING SAME

TECHNICAL FIELD

This application is a 35 USC §371 National Stage entry of International Application No. PCT/KR2012/002285 filed on Mar. 28, 2012, and claims priority from Korean Patent Application No. 10-2011-0027832 filed on Mar. 28, 2011 in the KIPO, the disclosure of which is incorporated herein by reference in its entirety.

The present invention relates to a conducting substrate and a touch screen comprising the same.

BACKGROUND ART

In general, a display device refers to monitors for a TV or a computer as a whole, and comprises a display diode forming an image and a case supporting the display diode.

Examples of the display diode may comprise a plasma display panel (PDP), a liquid crystal display (LCD), an electrophoretic display, a cathode-ray tube (CRT), an OLED display and the like. An RGB pixel pattern for implementing an image and an additional optical filter may be provided in the display diode.

Meanwhile, relating to a display device, as the spread of smart phones, tablet PCs, and IPTVs is accelerated, a demand for a touch function that uses human hands as a direct input device without a separate input device such as keyboards or remote controllers is growing. In addition, a multi-touch function for recognizing a specific point and taking notes is also required.

The touch screen that performs the aforementioned function may be classified into the following types according to a detection manner of a signal.

That is, there are a resistive type detecting a position pressed by pressure in a state where a direct voltage is applied through a change in current or voltage value, a capacitance type using capacitance coupling in a state where an alternating voltage is applied, an electromagnetic type detecting a selected position in a state where a magnetic field is applied as a change in voltage and the like.

Among them, the resistive type and capacitance type touch screens that are most extensively spread recognize the touch by a change in electric contact or capacitance by using the transparent conducting film such as the ITO film. However, since most of the transparent conducting films has high resistance of 150 ohm/square or more, sensitivity is reduced in enlargement, and when the touch screen is manufactured by using the same, there are a complexity that a patterning process of ITO and a patterning process of an electrode of a metal trace portion are sequentially performed by a process such as photolithography and a problem that a cost of an ITO film is rapidly increased as a size of a screen is increased, such that there are an increase in manufacturing cost and difficulty in application to enlargement while manufacturing is performed. In order to overcome this, currently, there is an effort to implement enlargement by using a metal pattern having the high conductivity. In the case where the metal pattern is used, the metal pattern is useful to area enlargement due to high conductivity of the metal, and is advantageous in view of yield and cost because the trace electrode and the image portion are formed simultaneously to reduce the number of processes.

However, in the case where the touch screen is constituted by using the metal pattern, additional optical phenomena occur due to structural characteristics different from those of a known ITO, one of them is a reflective diffraction phenomenon by a point light source such as sunlight, and another is a moiré phenomenon exhibited when a regularized metal pattern is used.

In this case, the reflective diffraction phenomenon means that when the point light source such as sunlight or interior LED radiates light on a surface where the metal pattern of the display is provided, in the case where the metal pattern is regular, a pattern is formed by forming diffraction by reflection of the point light source, reducing legibility of a user. The reflective diffraction phenomenon is being magnified as an optical property to be even more managed because adoption of lightweight and portable products is gradually increased in current displays to emphasize outdoor visibility and the like.

Separately, the moiré phenomenon is a phenomenon where another type of interference pattern is formed due to an interference phenomenon between the pixel and the pattern of the display in the case where a regular pattern is present on a pixel pattern or an electrode pattern of the display, and this phenomenon reduces legibility and disturbs mixing of colors of the pixel to cause a problem of reducing an image quality of the display.

In the case of a plasma display panel (PDP) as an example thereof, in the case where a metal mesh pattern for blocking electromagnetic waves is introduced, a moiré phenomenon may occur due to regularity of the pixel and the metal mesh pattern of the plasma display. Therefore, in order to solve this, in general, if the specification of the plasma display panel (PDP) is determined, an effort for solving the moiré phenomenon is made through an angle design of a metal mesh pattern of an optical filter.

However, avoidance of the moiré phenomenon through setting of the angle of the display pixel and the metal mesh pattern is cumbersome in that different patterns need to be used according to the size of the display and the pixel implementation manner.

DISCLOSURE

Technical Problem

The present invention has been made in an effort to develop a technology for improving performance of the aforementioned touch screen. Particularly, a pixel pattern has been more finely formed to implement high resolution in a recently extensively used LCD display panel, and different sizes and shapes of pixels are applied according to products for each manufacturer, such that it is becoming more and more difficult to manufacture products by introducing one consistent moiré avoidance design only by a known angle design of a mesh pattern.

Technical Solution

An exemplary embodiment of the present invention provides a conducting substrate comprising a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the number of vertexes of the closed figures is different from the number of vertexes of quadrangles having the same number as the closed figures.

Another exemplary embodiment of the present invention provides a conducting substrate comprising a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the number of vertexes of the closed figures is different from the number of vertexes of polygons formed by connecting the shortest distances between centers of mass of the closed figures.

Another exemplary embodiment of the present invention provides a conducting substrate comprising a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the closed figures have a value of the following Equation 1 of 50 or more:

(standard deviation of distances between vertexes/ average of the distances between the vertexes)× 100. [Equation 1]

Another exemplary embodiment of the present invention provides a conducting substrate comprising a board, and an electric conducting pattern provided on at least one surface of the board, wherein when an image of a transmission type diffraction pattern is obtained by radiating straight light emitted from a light source on one surface of the conducting substrate, the image has a value of the following Equation 2 of less than 21:

(standard deviation of strengths of the transmission type diffraction pattern according to an angle region/average strength of the transmission type diffraction patterns according to the angle region)×100. [Equation 2]

In Equation 2, the angle region means a region where 0 to 360° are divided every 10° from a center of the image of the transmission type diffraction pattern.

Another exemplary embodiment of the present invention provides a touch screen comprising an additional transparent board on the electric conducting pattern of the conducting substrate.

Another exemplary embodiment of the present invention provides a display comprising the touch screen, and a display module.

Advantageous Effects

The conducting substrate and the touch screen comprising the same according to the present invention may not block a view, have excellent conductivity, reduce a reflective diffraction phenomenon due to a point light source, and prevent a reduction in display image quality by a moiré phenomenon. In addition, since the electric conducting pattern according to the present invention can be formed by various methods such as an indirect printing method, a photolithography method, a photography method, a method using a hard mask, or a sputtering method after a desired pattern is previously set, the process is easily performed and the cost is low. Further, in the case where the electric conducting pattern according to the present invention is used, it is possible to control randomness and transmittance by artificially controlling randomness and the like when an irregular pattern is designed, and the regular patterns having the same pitch and linear densities per unit area are similar regardless of randomness, such that it is possible to ensure electric uniformity similar to that of the regular pattern.

BEST MODE

Figure 1:
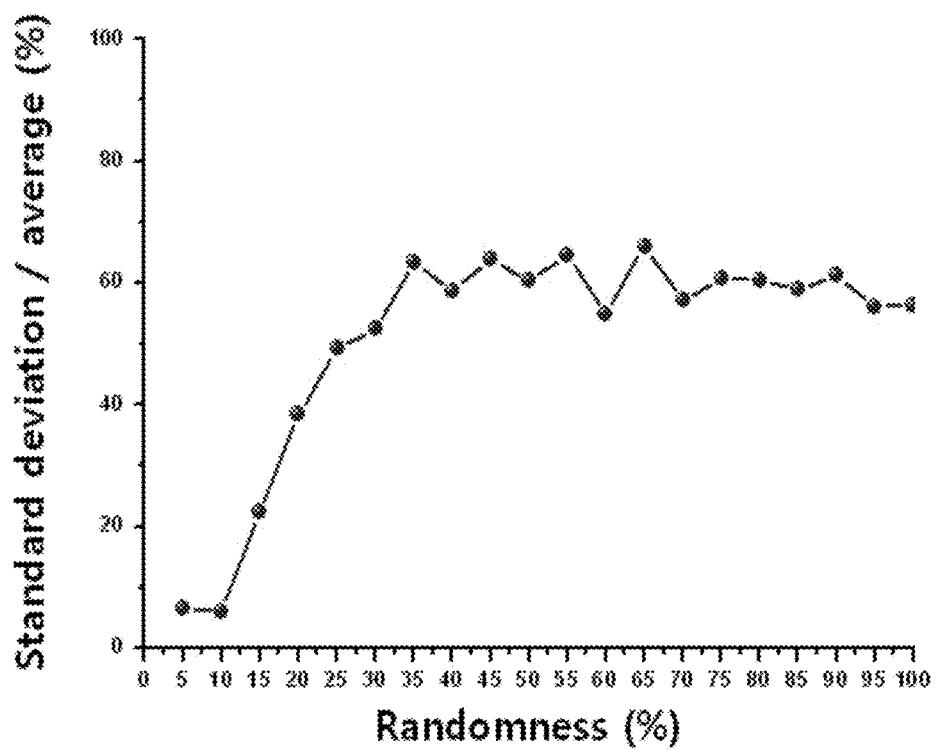
FIG. 1 is a view illustrating a value of (standard deviation of distances between vertexes/average of distances between vertexes) according to randomness of an electric conducting pattern according to an exemplary embodiment of the present invention.

Hereinafter, the present invention will be described in detail.

The present invention has been made in an effort to primarily provide a method for minimizing a reflective diffraction phenomenon due to a point light source in the case where a regularized pattern is used and an evaluation method and criteria of the reflective diffraction phenomenon in order to use the method in a display in practice, and further provide a pattern design method for basically solving the aforementioned moiré phenomenon, and a conductor comprising the same and a touch screen comprising the same.

In the case where a transparent entire surface conducting layer is formed like a known technology (ITO and the like), there is a problem in that resistance is excessively increased in proportion to transmittance. In addition, in the case where, like the grid method or linear method, the electric conducting pattern that is formed of one or more kind of regular pattern is comprised in a regular internal structure, for example, a display that has a pixel structure, an optical film that has a regular pattern structure, or a display that comprises an electrode structure, because of the light source that is adjacent to the pattern structures, a relative interference between the patterns occurs, such that a moiré phenomenon occurs, and if this moiré phenomenon occurs, a visible recognizing property (visibility) is reduced.

The conducting substrate according to the present invention comprises a board, and an electric conducting pattern provided on at least one surface on the board.

An exemplary embodiment of the present invention provides a conducting substrate that comprises a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the number of vertexes of the closed figures is different from the number of vertexes of quadrangles having the same number as the closed figures.

In the conducting substrate according to the present invention, the number of vertexes of the closed figures is different from the number of vertexes of the quadrangles having the same number as the closed figures. More specifically, the number of vertexes of the closed figures may be larger than or 1.9 to 2.1 times larger than the number of vertexes of the quadrangles having the same number as the closed figures, but is not limited thereto.

In the conducting substrate according to the present invention, the closed figures are continuously connected to each other, and for example, in the case where the closed figures are polygonal, the adjacent closed figures may have a shape sharing at least one side.

Another exemplary embodiment of the present invention provides a conducting substrate that comprises a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the number of vertexes of the closed figures is different from the number of vertexes of polygons formed by connecting shortest distances between the centers of masses of the closed figures.

In the conducting substrate according to the present invention, the number of vertexes of the closed figures is different from the number of vertexes of the polygons formed by connecting the shortest distances between centers of mass of the closed figures. More specifically, the number of vertexes of the closed figures may be larger than or 1.9 to 2.1 times larger than the number of vertexes of the polygons formed by connecting the shortest distances between the centers of masses of the closed figures, but is not limited thereto.

Another exemplary embodiment of the present invention provides a conducting substrate that comprises a board, and an electric conducting pattern provided on at least one surface of the board, wherein the electric conducting pattern comprises a border structure of closed figures continuously connected and does not comprise the closed figures having the same shape in a predetermined unit area (1 cm×1 cm), and the closed figures have a value of the following Equation 1 of 50 or more.

(standard deviation of distances between vertexes/ average of the distances between the vertexes)× 100 [Equation 1]

Another exemplary embodiment of the present invention provides a conducting substrate that comprises a board, and an electric conducting pattern provided on at least one surface of the board, wherein when an image of a transmission type diffraction pattern is obtained by radiating straight light emitted from a light source on one surface of the conducting substrate, the image has a value of the following Equation 2 of less than 21.

(standard deviation of strengths of the transmission type diffraction pattern according to an angle region/average strength of the transmission type diffraction patterns according to the angle region)×100 [Equation 2]

In Equation 2, the angle region means a region where 0 to 360° are divided every 10° from a center of the image of the transmission type diffraction pattern.

In the conducting substrate according to the present invention, when the image of the transmission type diffraction pattern is obtained, the image may have a value of the following Equation 2 of less than 21, 15 or less, or 10 or less.

In the conducting substrate according to the present invention, the electric conducting pattern comprises the border structure of the continuously connected closed figures, and the border structure of the closed figures may be variously modified into a straight line, a curved line, a zigzag, a combination thereof and the like.

In the conducting substrate according to the present invention, the electric conducting pattern may not comprise the closed figures that are the same as each other in the unit area.

In the conducting substrate according to the present invention, when the electric conducting pattern comprises the border structure of the continuously connected closed figures and angles of lines constituting a border of the closed figures to a predetermined straight line are divided from 0 to 180° in a unit of 10°, a value of the following Equation 3 may be less than 21, 15 or less, or 10 or less with respect to the number of lines belonging to each angle range.

(standard deviation of numbers of lines corresponding to the angle range/average of the numbers of the lines corresponding to the angle range)×100 [Equation 3]

In the conducting substrate according to the present invention, the values of Equations 1 to 3 may be calculated in the unit area of the electric conducting pattern. The unit area may be an area where the electric conducting pattern is formed, for example, 3.5 cm×3.5 cm and the like, but is not limited thereto.

The numerical values of Equations 1 to 3 may be supported by the tables of the Examples as described below, the drawings and the like.

In the conducting substrate according to the present invention, it is defined that the vertex means a point at which lines constituting the border of the closed figures of the electric conducting pattern cross each other.

Further, in the present invention, a transparent board may be additionally comprised in a surface from which the electric conducting pattern is visible.

In the touch screen according to the present invention, examples of the additional transparent board may comprise reinforced glass, transparent plastic and the like, but are not limited thereto.

The conducting substrate comprising the electric conducting pattern may form the electric conducting layer by using a deposition method, for example, a method such as a sputtering method, a CVD (chemical vapor deposition) method, a thermal evaporation method, and an e-beam deposition method, and the electric conducting layer may be patterned to form an electric conducting pattern.

As described above, a fine electric conducting pattern required in the touch screen may be implemented by forming the pattern. In the touch screen, in the case where the fine electric conducting pattern is not implemented, physical properties required in the touch screen, such as resistance cannot be obtained.

In the touch screen using a known metal mesh pattern, since a solution for avoiding a moiré phenomenon is not basically provided, in the present invention, an irregular pattern is applied as the electric conducting pattern. In this case, a critical value at which the moiré phenomenon does not occur regardless of the display was confirmed to be quantified through confirmation of occurrence of moiré and confirmation of the reflective diffraction phenomenon according to randomness.

In the present invention, the electric conducting pattern comprises the border structure of the continuously connected closed figures, and the number of vertexes of the closed figures is different from the number of vertexes of quadrangles having the same number as the closed figures.

Further, in the present invention, the electric conducting pattern comprises the border structure of the continuously connected closed figures, and the number of vertexes of the closed figures is different from the number of vertexes of polygons formed by connecting the shortest distances between the centers of the masses of the closed figures.

Further, in the present invention, the electric conducting pattern comprises the border structure of the continuously connected closed figures, and the closed figures have a value of Equation 1 of 50 or more.

The electric conducting pattern according to the present invention may have a shape of the border structure of the closed figures obtained by after disposing predetermined points in regularly arranged measure unit cells, connecting the points to the closest points thereto as compared to the distances from other points.

In this case, in the case where randomness is introduced into a manner where predetermined points are disposed in the regularly arranged measure unit cells, the electric conducting pattern according to the present invention may be formed. For example, in the case where randomness is provided as 0, if the measure unit cell is a square, the electric conducting pattern has a square mesh structure, and if the measure unit cell is a regular hexagon, the electric conducting pattern has a honeycomb structure. That is, the electric conducting pattern according to the present invention means a pattern where randomness is not 0.

A leaning phenomenon and the like of lines constituting the pattern may be suppressed, uniform transmittance may be obtained from the display, the linear density to the unit area may be maintained as the same value, and uniform conductivity may be ensured by the electric conducting pattern having the irregular pattern shape according to the present invention.

In the present invention, the material of the electric conducting pattern is not particularly limited, but the metal is preferable. It is preferable that the material of the electric conducting pattern has excellent conductivity and can be easily etched.

In the present invention, even though the material having the total reflectance of 70 to 80% or more is used, it is possible to decrease the total reflectance, decrease visibility of the electric conducting pattern, and maintain or improve a contrast property.

It is preferable that detailed examples of the material of the electric conducting pattern comprise a single film or a multi-layered film comprising gold, silver, aluminum, copper, neodymium, molybdenum, nickel, or an alloy thereof. Herein, the thickness of the electric conducting pattern is not particularly limited, but is preferably 0.01 to 10 μm in terms of conductivity of the electric conducting pattern and economic efficiency of the forming process thereof.

The forming of the electric conducting pattern may use a method using an etching resist pattern. The etching resist pattern may be formed by using a printing method, a photolithography method, a photography method, a method using a mask, or a laser transferring, for example, a thermal transfer imaging, and the printing method or photolithography method is more preferable. The electric conducting pattern may be etched by using the etching resist pattern, and the etching resist pattern may be removed.

In the present invention, the line width of the electric conducting pattern may be 10 μm or less, 7 μm or less, 5 μm or less, 4 μm or less, 2 μm or less, or 0.1 μm or more. To be more specific, the line width of the electric conducting pattern may be 0.1 to 1 μm, 1 to 2 μm, 2 to 4 μm, 4 to 5 μm, 5 to 7 μm or the like, but is not limited thereto.

Further, the line width of the electric conducting pattern may be 10 μm or less and the thickness thereof may be 10 μm or less, the line width of the electric conducting pattern may be 7 μm or less and the thickness thereof may be 1 μm or less, or the line width of the conducting pattern may be 5 μm or less and the thickness thereof may be 0.5 μm or less.

In the present invention, in the electric conducting pattern, the number of vertexes of the closed figures in the unit area (3.5 cm×3.5 cm) may be 6,000 or more, 7,000 or more, 15,000 or more, and 245,000 or less, and may be controlled according to transmittance and conductivity required by the person with ordinary skill in the art.

To be more specific, in the present invention, the line width of the electric conducting pattern may be 10 μm or less, and in the electric conducting pattern, the number of vertexes of the closed figures in the area of 3.5 cm×3.5 cm may be 6,000 to 245,000. Further, the line width of the electric conducting pattern may be 7 μm or less, and in the electric conducting pattern, the number of vertexes of the closed figures in the area of 3.5 cm×3.5 cm may be 7,000 to 62,000. Further, the line width of the electric conducting pattern may be 5 μm or less, and in the electric conducting pattern, the number of vertexes of the closed figures in the area of 3.5 cm×3.5 cm may be 15,000 to 62,000.

The opening ratio of the electric conducting pattern, that is, the ratio of the area not covered by the pattern, may be 70% or more, 85% or more, and 95% or more. In addition, the opening ratio of the electric conducting pattern layer may be 90 to 99.9%, but is not limited thereto.

The electric conducting pattern used in the present invention is appropriately a material having specific resistance of $1 \times 10^6$ to $30 \times 10^6$ ohm·cm, and more preferably $7 \times 10^6$ ohm·cm or less.

In the present invention, surface resistance of the conducting substrate may be 1 to 300 ohm/square. The matter within the aforementioned range is advantageous in operation of the touch screen.

In the present invention, a lateral surface of the electric conducting pattern may have a positive taper angle, but the conducting pattern positioned on an opposite surface of a board side of the conducting pattern may have a negative taper angle.

The touch screen according to the present invention may comprise an additional conducting substrate in addition to the aforementioned conducting substrate comprising the board and the electric conducting pattern.

Further, in the touch screen according to the present invention, the electric conducting patterns may be provided on both surfaces of the board.

The touch screen according to the present invention may further comprise an electrode portion or a pad portion in addition to an effective screen portion where the electric conducting pattern is formed on the conducting substrate, and in this case, the effective screen portion and the electrode portion/pad portion may be constituted by the same conductor and have the same thickness, such that there may be no joints therein.

The touch screen according to the present invention may be provided with a protection film, a polarizing film, an antireflection film, an antiglare film, a fingerprint-resistant film, a low reflection film or the like on one surface of each board.

The opening ratio of the touch screen according to the present invention, that is, the ratio of the area not covered by the pattern, may be 70% or more, 85% or more, and 95% or more. In addition, the opening ratio of the touch screen may be 90 to 99.9%, but is not limited thereto.

Further, the conducting substrate according to the present invention may further comprise a darkening layer provided on at least one surface of the electric conducting pattern and provided in a region corresponding to the electric conducting pattern.

In the present invention, a reflective diffraction intensity of a reflective diffraction image obtained by radiating light emitted from a point light source on one surface from which the darkening layer is visible may be reduced by 60% or more as compared to the conducting substrate having the same constitution except that the electric conducting pattern is formed of Al and does not comprise the darkening layer. Herein, the reflective diffraction intensity may be reduced by 60% or more, 70% or more, and 80% or more as compared to the conducting substrate having the same constitution except that the electric conducting pattern is formed of Al and does not comprise the darkening layer. For example, the reflective diffraction intensity may be reduced by 60 to 70%, 70 to 80%, and 80 to 85%.

In the present invention, total reflectance measured by using a total reflectance measuring device with an assumption of ambient light on one surface from which the darkening layer is visible may be reduced by 20% or more as compared to the conducting substrate having the same constitution except that the electric conducting pattern is formed of Al and does not comprise the darkening layer. Herein, the total reflectance may be reduced by 20% or more, 25% or more, and 30% or more as compared to the conducting substrate having the same constitution except that the electric conducting pattern is formed of Al and does not comprise the darkening layer. For example, the total reflectance may be reduced by 25 to 50%.

In the present invention, the darkening layer may be provided on an upper surface and a lower surface of the electric conducting pattern, provided on at least a portion of a lateral surface as well as the upper surface and lower surface of the electric conducting pattern, and provided on the upper surface, the lower surface and the entire lateral surface of the electric conducting pattern.

In the present invention, the darkening layer may be provided on the entire surface of the electric conducting pattern to reduce visibility according to high reflectance of the electric conducting pattern. In this case, when the darkening layer is bonded to a layer having high reflectance such as the conducting layer, since the darkening layer has destructive interference and self-light absorbance under a specific thickness condition, there is exhibited an effect of reducing the reflectance by the conducting pattern by similarly adjusting quantities of light reflecting on the darkening layer and light reflecting on the conducting pattern through the darkening layer and, at the same time, guiding destructive interference between two lights under the specific thickness condition.

In this case, in the color range of the pattern region formed of the darkening layer and the electric conducting pattern, which is measured from the surface from which the darkening layer of the conducting substrate according to the present invention is visible, an L value may be 20 or less, an A value may be −10 to 10, and a B value may be −70 to 70, the L value may be 10 or less, the A value may be −5 to 5, and the B value may be 0 to 35, or the L value may be 5 or less, the A value may be −2 to 2, and the B value may be 0 to 15 based on a CIE LAB color coordinate.

Further, the total reflectance of the pattern region formed of the darkening layer and the electric conducting pattern, which is measured from the surface from which the darkening layer of the conducting substrate according to the present invention is visible, may be 17% or less, 10% or less, or 5% or less based on external light of 550 nm.

Figure 4:
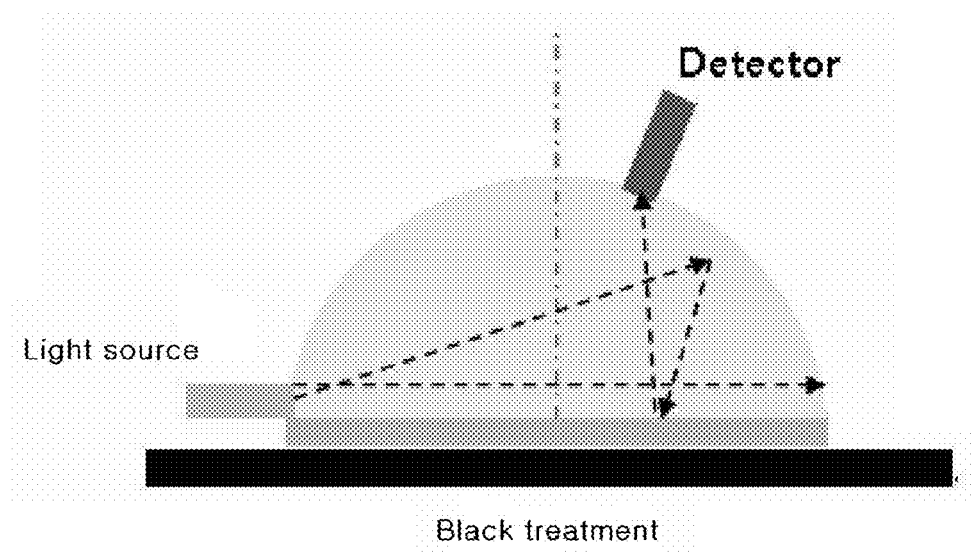
FIG. 4 is a view illustrating constitution of a device for measuring total reflectance of the conducting substrate according to the exemplary embodiment of the present invention.
Figure 5:
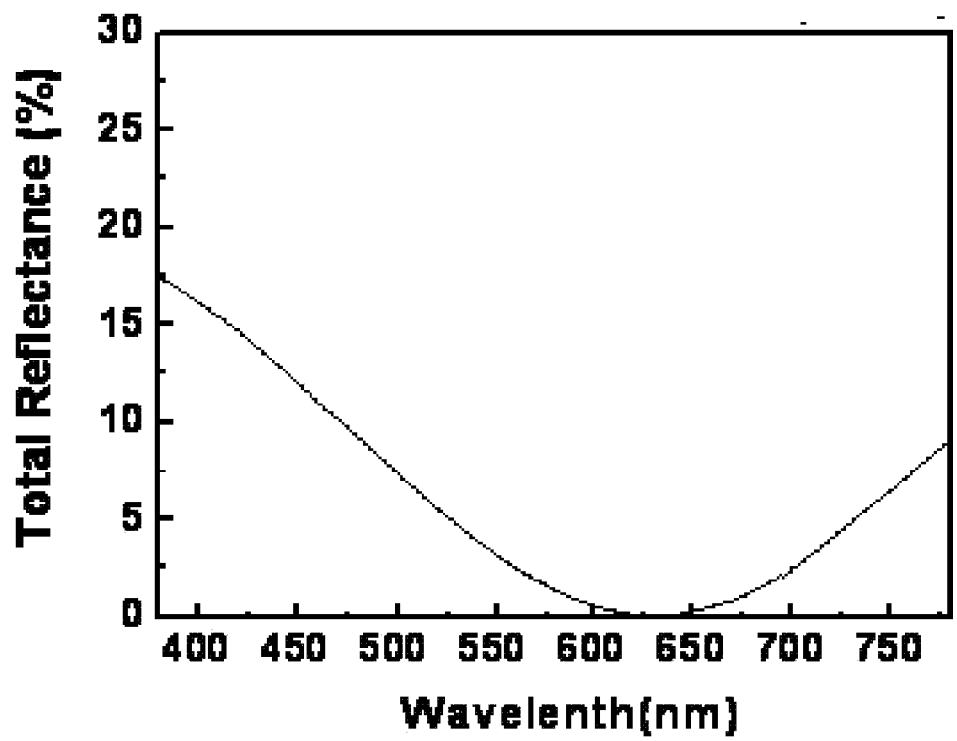
FIG. 5 is a view illustrating a graph of the total reflectance of the conducting substrate according to the exemplary embodiment of the present invention.

Herein, the total reflectance means reflectance obtained in consideration of both diffuse reflectance and specular reflectance. The total reflectance is a value observed by setting the reflectance of an opposite surface of the surface to be measured in term of reflectance to 0 by using a black paste, a tape or the like and then measuring only the reflectance of the surface to be measured, and in this case, a diffuse light source that is most similar to the ambient light condition is introduced as the provided light source. Further, in this case, the measurement position of the reflectance is set based on a position that is inclined at about 7° from a horizontal line of a hemisphere of an integrating sphere. The following FIG. 4 illustrates constitution of a device for measuring total reflectance, and the following FIG. 5 illustrates a graph of the total reflectance of the conducting substrate according to the exemplary embodiment of the present invention.

In the present invention, the darkening layer and the electric conducting pattern may be patterned simultaneously or separately, but layers for forming each pattern are separately formed. However, it is most preferable to form the electric conducting pattern and the darkening layer simultaneously in order to allow the electric conducting pattern and the darkening layer to be present on the precisely corresponding surfaces.

By forming the pattern as described above, while an effect of the darkening layer is optimized and maximized, it is possible to implement a fine electric conducting pattern required in a touch screen. In the touch screen, in the case where the fine electric conducting pattern is not implemented, physical properties required in the touch screen, such as resistance cannot be obtained.

In the present invention, since the darkening layer and the electric conducting pattern form a laminate structure by a separate pattern layer, the structure is different from a structure in which at least a portion of a light absorption material is recessed or dispersed in an electric conducting pattern, or a structure in which a portion of a surface is physically or chemically deformed by performing surface treatment on a conducting layer of a single layer.

Further, in the touch screen according to the present invention, the darkening layer is directly provided on the board or electric conducting pattern while an attachment layer or adhesive layer is not interposed therebetween. The attachment layer or adhesive layer may affect durability or optical properties. In addition, a method for manufacturing the laminate comprised in the touch screen according to the present invention is largely different from the case where the attachment layer or adhesive layer is used. Moreover, as compared to the case where the attachment layer or adhesive layer is used, in the present invention, interface properties between the board or electric conducting pattern and the darkening layer are excellent.

In the present invention, any thickness may be used as long as the darkening layer has destructive interference property and absorption coefficient property that are the aforementioned physical properties and the thickness of the darkening layer satisfies the thickness condition of $\lambda/(4 \times n) = N$ (herein, N is an odd number) when the wavelength of light is set by $\lambda$ and the refractive index of the darkening layer is defined by n. However, during the manufacturing process, in consideration of an etching property with the electric conducting pattern, it is preferable that the thickness is selected from 10 nm to 400 nm, but the preferable thickness may be different according to the used material and manufacturing process, and the scope of the present invention is not limited to the above numerical range.

The darkening layer may be formed of a single layer, or a plurality of layers of two or more layers.

It is preferable that the darkening layer have a color that is close to an achromatic color. However, the color is not necessary to be the achromatic color, and the darkening layer may be introduced as long as the reflectance is low even though the darkening layer has a color. In this case, the achromatic color means a color exhibited when light that is incident on a surface of a body is not selectively absorbed but evenly reflected and absorbed with respect to a wavelength of each component. In the present invention, the darkening pattern may use a material having a standard deviation of total reflectance for each wavelength of 50% or less in a visible ray region (400 to 800 nm) when the total reflectance is measured.

The material of the darkening layer is a light absorbing material, and preferably may use any materials without a particular limitation as long as the material is made of metal, metal oxide, metal nitride or metal oxynitride having the aforementioned physical properties when the entire surface layer is formed.

For example, the darkening layer may be an oxide film, a nitride film, an oxynitride film, a carbide film, a metal film and a combination thereof formed by using Ni, Mo, Ti, Cr, and the like under a deposition condition set by the person with ordinary skill The present inventors confirmed that in the case where Mo is used, the case where nitrides are used together with oxides has an optical property more suitable to the darkening pattern mentioned in the present invention as compared to the case where oxides are used alone.

As a detailed example thereof, the darkening layer may comprise both Ni and Mo. The darkening pattern may comprise 50 to 98 atom % of Ni and 2 to 50 atom % of Mo, and may further comprise 0.01 to 10 atom % of other metals, for example, atoms such as Fe, Ta, and Ti. Herein, the darkening pattern, if necessary, may further comprise 0.01 to 30 atom % of nitrogen or 4 atom % or less of oxygen and carbon.

As another detailed example thereof, the darkening layer may comprise a dielectric material selected from SiO, $SiO_2$, $MgF_2$ and $SiN_x$ (x is an integer of 1 or more) and a metal selected from Fe, Co, Ti, V, Al, Cu, Au and Ag, and may further comprise an alloy of two or more kinds of metals selected from Fe, Co, Ti, V, Al, Cu, Au and Ag. It is preferable that the dielectric material is distributed to be gradually decreased in an amount as the dielectric material goes away from an incident direction of external light, and the metal and alloy component are distributed on the contrary. In this case, it is preferable that the content of the dielectric material is 20 to 50 wt % and the content of the metal is 50 to 80 wt %. In the case where the darkening pattern further comprises the alloy, it is preferable that the darkening pattern comprises 10 to 30 wt % of the dielectric material, 50 to 80 wt % of the metal, and 5 to 40 wt % of the alloy.

As another detailed example thereof, the darkening layer may be formed of a thin film comprising an alloy of nickel and vanadium, and one or more oxide, nitride, oxynitride of nickel and vanadium. In this case, it is preferable that vanadium is comprised in a content of 26 to 52 atom %, and it is preferable that an atomic ratio of vanadium to nickel is 26/74 to 52/48.

As another detailed example thereof, the darkening layer may comprise a transition layer in which two or more elements are comprised and a composition ratio of one element is increased by about a maximum of 20% per 100 angstrom according to an incident direction of external light. In this case, one element may be a metal element such as chrome, tungsten, tantalum, titanium, iron, nickel or molybdenum, and an element other than the metal element may be oxygen, nitrogen or carbon.

As another detailed example thereof, the darkening layer may comprise a first chrome oxide layer, a metal layer, a second chrome oxide layer and a chrome mirror, and in this case, may comprise metal selected from tungsten, vanadium, iron, chrome, molybdenum and niobium instead of chrome. The metal layer may have a thickness of 10 to 30 nm, the first chrome oxide layer may have a thickness of 35 to 41 nm, and the second chrome oxide layer may have a thickness of 37 to 42 nm.

As another detailed example thereof, a laminate structure of an alumina ($Al_2O_3$) layer, a chrome oxide ($Cr_2O_3$) layer and a chrome (Cr) layer may be used as the darkening layer. Herein, the alumina layer has characteristics of improving a reflection property and preventing light diffusion, and the chrome oxide layer may improve a contrast property by decreasing inclined surface reflectance.

In the present invention, the darkening layer is provided in a region corresponding to the electric conducting pattern. Herein, the region corresponding to the electric conducting pattern means that the region has the pattern having the same shape as the electric conducting pattern. However, the pattern size of the darkening layer does not need to be completely identical to the electric conducting pattern, and the case where the line width of the darkening layer is narrower or wider as compared to the line width of the electric conducting pattern is comprised in the scope of the present invention. For example, it is preferable that the darkening layer have an area of 80 to 120% of an area in which the electric conducting pattern is provided.

It is preferable that the darkening layer have a pattern shape having the same line width as or larger line width than the electric conducting pattern.

In the case where the darkening layer has the pattern shape having the larger line width than that of the electric conducting pattern, since an effect in which the darkening layer covers the electric conducting pattern when observed by the user may be enlarged, there is an advantage in that an effect by gloss or reflection of the electric conducting pattern may be efficiently blocked. However, even though the line width of the darkening layer is the same as the line width of the electric conducting pattern, a target effect of the present invention can be accomplished. It is preferable that the line width of the darkening layer is larger than the line width of the electric conducting pattern by a value according to the following Equation 1.

$$T\text{con} \times \tangent \Theta_3 \times 2 \qquad \text{[Equation 1]}$$

In Equation 1,

Tcon is a thickness of the conducting pattern, and $\Theta_3$ is an angle between light and a tangential line with respect to the surface of the board when light that is incident from a position of the vision of the user of the touch screen passes through the corners of the conducting pattern and the darkening pattern.

$\Theta_3$ is an angle obtained by modifying an angle ($\Theta_1$) between the vision of the user of the touch screen and the board by a refractive index of the board and a refractive index of a medium of a region in which the darkening pattern and the conducting pattern are disposed, for example, an adhesive of the touch screen according to Snell's law.

For example, assuming that an observer observes the laminate so that the value of $\Theta_3$ forms an angle of about 80° and the thickness of the conducting pattern is about 200 nm, it is preferable that the line width of the darkening pattern is larger than that of the conducting pattern by about 2.24 μm (200 nm×tan(80)×2) based on the lateral surface. However, as described above, even in the case where the darkening pattern has the same line width as the conducting pattern, a target effect of the present invention can be implemented.

In the present invention, the constitution of the device shown in the following FIG. 6 was introduced in order to evaluate optical properties of the conducting substrate comprising the electric conducting pattern and the darkening layer according to the present invention.

Figure 6:
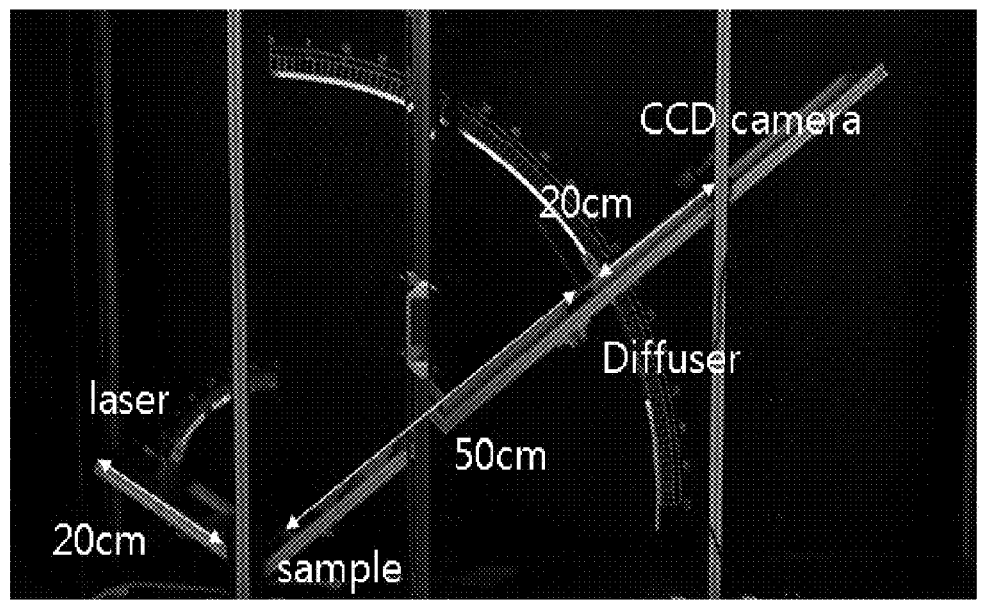
FIG. 6 is a view illustrating a reflective diffraction device for evaluating light properties of the conducting substrate according to the exemplary embodiment of the present invention.

In the present invention, the reflective diffraction device of the following FIG. 6 was introduced in order to evaluate the reflective diffraction property. The constitution of the reflective diffraction device is described in the following Table 1.

TABLE 1

| Division | Bare | Al 250 |
|---|---|---|
| Laser | Model | SL-532 nm-GLM-0.12 (cross line) |
|  | Wavelength | 532 nm |
| Diffuser | Size | 200 mm × 200 mm |
|  | Note | Polishing using the bead having the size of about 1200/inch$^2$ |
| CCD | Model | AM413ZT Dino-Lite |

In this case, the device was constituted so that light reflecting on the sample was detected by identically forming the angle at which the laser is incident and the angle at which the laser reflects. In this case, the used laser source was a single light source having a wavelength of 532 nm. This is because in the case where light having the mixed color is used instead of light having the single color, there is a problem in that diffraction properties are differently exhibited according to the wavelength and the different diffraction properties overlap with each other to make a desired observation difficult. Furthermore, in the present invention, a diffuser was introduced in order to form an image of light emitted from the laser light source and reflecting on the sample, and the diffuser was manufactured by polishing beads having the size of about 500 μm. This is because in the case of a general transparent glass, since there is no phenomenon of formation of the image, it is difficult to obtain the image, but in the case of a completely opaque board, an observation position of the image is complicated. Finally, in the present invention, data of the reflective diffraction image are obtained by positioning a camera on an opposite surface of the diffuser. After the image size of the image data obtained by this method was changed into 256× 256 through a general image software, the intensity to the reflective diffraction was subjected to compiling of statistics through a software that is called Scion image.

Figure 7:
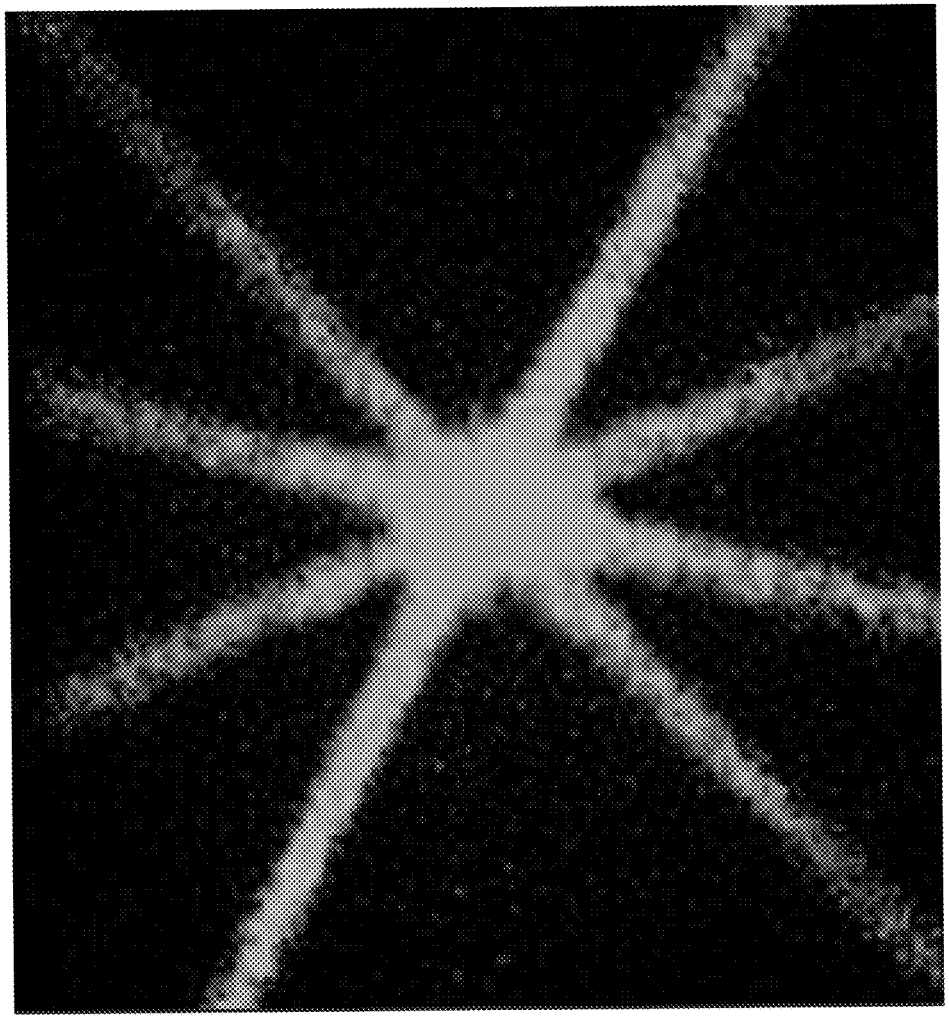
FIG. 7 is a view illustrating a reflective diffraction image of a known conducting substrate.

The following FIG. 7 illustrates a reflective diffraction image of a known conducting substrate not comprising a darkening layer.

In addition, the present invention provides a method of manufacturing a touch screen.

According to an exemplary embodiment, the present invention provides a method of manufacturing a touch screen, which comprises forming an electric conducting pattern on a board.

According to another exemplary embodiment, the present invention provides a method of manufacturing a touch screen, which comprises forming a conducting layer for forming a conducting pattern on a board; and patterning the conducting layer.

In the manufacturing method, the material and forming method of the above each layer may be used.

Further, the touch screen according to the present invention comprises the conducting substrate. For example, the conducting substrate according to the exemplary embodiment of the present invention may be used as a touch-sensitive type electrode substrate in a capacitance type touch screen.

The touch screen according to the exemplary embodiment of the present invention may comprise a lower board; an upper board; and an electrode layer provided on any one surface of a surface of the lower board that is in contact with the upper board and a surface of the upper board that is in contact with the lower board or both the surfaces. The electrode layer may perform functions of transmission and receiving of signals to detect the X axis and Y axis positions.

In this case, one or two of the electrode layer provided on the lower board and the surface of the lower board that is in contact with the upper board; and the electrode layer provided on the upper board and the surface of the upper board that is in contact with the lower board may be the conducting substrate according to the exemplary embodiment of the present invention. In the case where only any one of the electrode layers is the conducting substrate according to the present invention, the other one may have the pattern known in the art.

In the case where the electrode layer is provided on one surface of each of both the upper board and the lower board to form two electrode layers, an insulation layer or a spacer may be provided between the lower board and the upper board so as to constantly maintain an interval between the electrode layers and prevent connection therebetween. The insulation layer may comprise an adhesive or a UV or heat curable resin.

The touch screen may further comprise a ground portion that is connected to the electric conducting pattern as described above. For example, the ground portion may be formed at an edge portion of the surface on which the electric conducting pattern of the board is formed. At least one of an antireflection film, a polarizing film, and a fingerprint resistant film may be provided on at least one surface of the laminate comprising the conducting substrate. Other kinds of functional films may be further comprised in addition to the aforementioned functional films according to the design specification. The touch screen may be applied to a display device such as an OLED display panel (PDP), a liquid crystal display (LCD), a cathode-ray tube (CRT), and a PDP.

Further, the present invention provides a display comprising the touch screen and a display module.

Mode For Invention

A better understanding of the present invention may be obtained in light of the following Examples which are set forth to illustrate, but are not to be construed to limit the present invention.

EXAMPLE

Examples 1 to 2

One of the methods of differentiating an irregular pattern type of electric conducting pattern according to the present invention from a general regular pattern having randomness of 0 is a method of confirming the number of vertexes of the line in the unit area. That is, the case where all distances of the vertexes constituting the closed figure are not the same as each other and the number of vertexes of a basic figure constituting the pattern is about two times larger than the number of vertexes of another figure formed by connecting the centers of masses of the closed figures may be defined as the irregular pattern type of electric conducting pattern according to the present invention.

This difference can be seen by, as described in the following Tables 2 and 3, comparing the numbers of polygons according to randomness existing in the unit area (3.5 cm×3.5 cm) of the known regular pattern and the electric conducting pattern according to the present invention. That is, in the case where the measure unit cell is square, the closed figure of the electric conducting pattern according to the present invention mainly forms a hexagonal closed figure, such that the number of vertexes is increased by about two times as compared to the regular pattern.

Example 3

Figure 3:
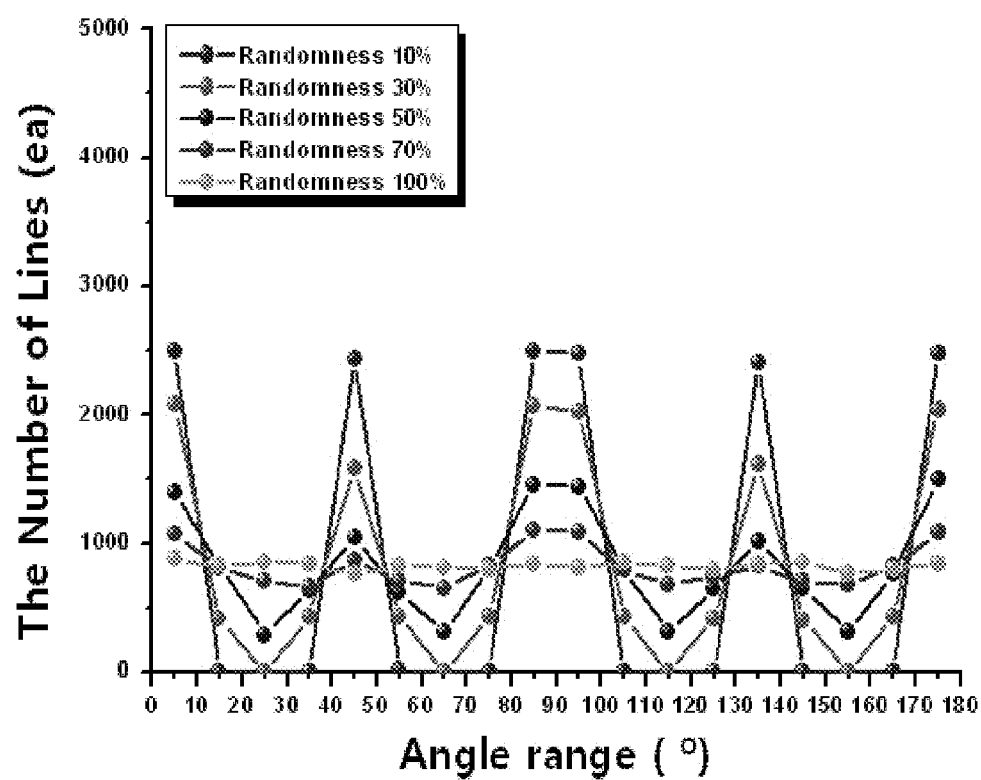
FIG. 3 is a view illustrating a number distribution according to angles of components of each side constituting the electric conducting pattern according to the exemplary embodiment of the present invention.

Further, in the present invention, the relationship of the distances between the vertexes and the number distribution of components of the sides constituting the electric conducting pattern in the unit area according to the angle were confirmed. As a result, the results of the following Table 4 and FIG. 3 could be obtained, and from the results thereof, it could be confirmed that the numbers of lines according to the angle were relatively uniformly distributed in the case where the randomness was 70% or more.

TABLE 2

Example 1

| | Polygonal shape | | | | | | | | | |
|---|---|---|---|---|---|---|---|---|---|---|
| | Triangle | Quadrangle | Pentagon | Hexagon | Heptagon | Octagon | Nonagon | Decagon | Hendecagon | Dodecagon | Number |
| Mesh | — | 30276 | — | — | — | — | — | — | — | — | 30276 |
| Randomness 10% | — | 1514 | 8113 | 12741 | 6766 | 1142 | — | — | — | — | 30276 |
| Randomness 30% | — | 1257 | 7933 | 12598 | 7162 | 1283 | — | — | — | — | 30233 |
| Randomness 50% | — | 1091 | 8140 | 12551 | 7056 | 1438 | — | — | — | — | 30276 |
| Randomness 70% | — | 910 | 8310 | 12657 | 6889 | 1472 | 5 | — | — | — | 30243 |
| Randomness 100% | 44 | 1722 | 8160 | 11418 | 6671 | 1899 | 270 | 24 | 2 | 2 | 30212 |

TABLE 3

Example 2

| | Polygonal shape | | | | | | | | | |
|---|---|---|---|---|---|---|---|---|---|---|
| | Triangle | Quadrangle | Pentagon | Hexagon | Heptagon | Octagon | Nonagon | Decagon | Hendecagon | Dodecagon | Number |
| Mesh | — | 4761 | — | — | — | — | — | — | — | — | 4761 |
| Randomness 10% | — | 233 | 1280 | 1989 | 1069 | 190 | — | — | — | — | 4761 |
| Randomness 30% | — | 178 | 1248 | 2011 | 1135 | 189 | — | — | — | — | 4761 |
| Randomness 50% | — | 168 | 1273 | 1981 | 1105 | 231 | — | — | — | — | 4758 |
| Randomness 70% | — | 138 | 1314 | 1978 | 1065 | 244 | 1 | — | — | — | 4740 |
| Randomness 100% | 5 | 280 | 1243 | 1805 | 1052 | 290 | 42 | 4 | — | — | 4721 |

Figure 2:
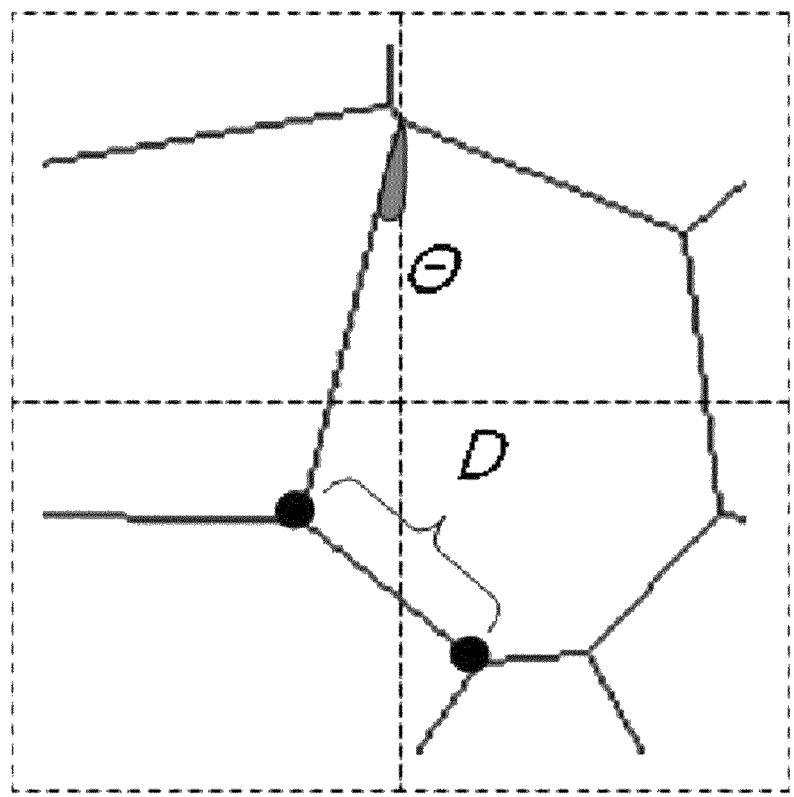
FIG. 2 is a view illustrating the distance between vertexes of the electric conducting pattern according to the exemplary embodiment of the present invention.

Based on the aforementioned content, in the present invention, the relationship between randomness of the electric conducting pattern and removal of the actual moiré was to be confirmed. To this end, first, (standard deviation of the distances between the vertexes/average of the distances between the vertexes) according to the randomness was confirmed, and as a result, as shown in the following FIG. 1, it could be confirmed that there was convergence of about 55% at the randomness of 35% or more. Herein, the distance (D) between the vertexes may be defined as shown in the following FIG. 2. Accordingly, in the case where (standard deviation of the distances between the vertexes/average of the distances between the vertexes) is considered, it can be confirmed that the same property is ensured at the randomness of 35% or more.

TABLE 4

| | Randomness | | | | | |
|---|---|---|---|---|---|---|
| Angle | 0 | 10% | 30% | 50% | 70% | 100% |
| 0 or more to less than 10 | 4970 | 2501 | 2079 | 1396 | 1070 | 885 |
| 10 or more to less than 20 | 0 | 0 | 414 | 829 | 818 | 821 |
| 20 or more to less than 30 | 0 | 0 | 3 | 292 | 710 | 852 |
| 30 or more to less than 40 | 0 | 7 | 427 | 638 | 666 | 843 |
| 40 or more to less than 50 | 0 | 2432 | 1590 | 1045 | 868 | 761 |
| 50 or more to less than 60 | 0 | 15 | 434 | 616 | 710 | 825 |

TABLE 4-continued

| Angle | Randomness | | | | | |
|---|---|---|---|---|---|---|
| | 0 | 10% | 30% | 50% | 70% | 100% |
| 60 or more to less than 70 | 0 | 2 | 1 | 312 | 653 | 818 |
| 70 or more to less than 80 | 0 | 0 | 437 | 818 | 833 | 803 |
| 80 or more to less than 90 | 0 | 2501 | 2073 | 1456 | 1101 | 847 |
| 90 or more to less than 100 | 4970 | 2475 | 2028 | 1442 | 1093 | 814 |
| 100 or more to less than 110 | 0 | 0 | 432 | 790 | 791 | 853 |
| 110 or more to less than 120 | 0 | 1 | 4 | 311 | 687 | 822 |
| 120 or more to less than 130 | 0 | 10 | 417 | 655 | 737 | 800 |
| 130 or more to less than 140 | 0 | 2408 | 1612 | 1015 | 819 | 837 |
| 140 or more to less than 150 | 0 | 8 | 409 | 648 | 706 | 854 |
| 150 or more to less than 160 | 0 | 0 | 1 | 317 | 685 | 764 |
| 160 or more to less than 170 | 0 | 0 | 435 | 769 | 826 | 801 |
| 170 or more to less than 180 | 0 | 2477 | 2041 | 1497 | 1086 | 844 |

Example 4

Figure 8:
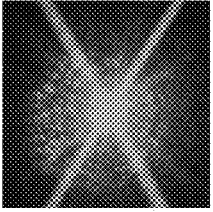
FIG. 8 is a view illustrating a reflective diffraction and a moiré image of the conducting substrate according to the exemplary embodiment of the present invention.
Figure 8:
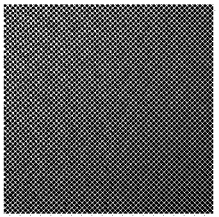
Figure 8:
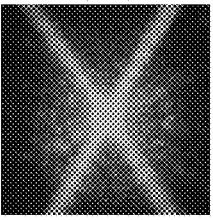
Figure 8:
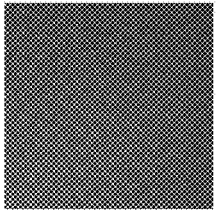
Figure 8:
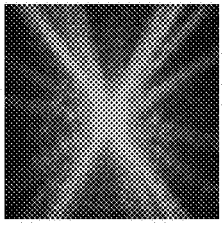
Figure 8:
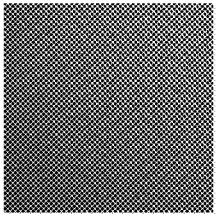
Figure 8:
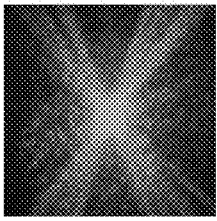
Figure 8:
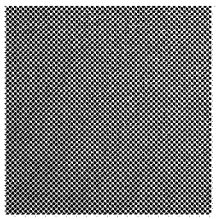
Figure 8:
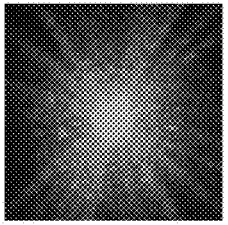
Figure 8:
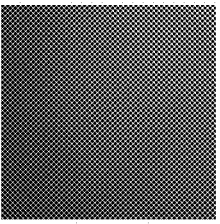
Figure 8:
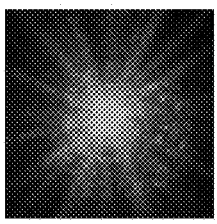
Figure 8:
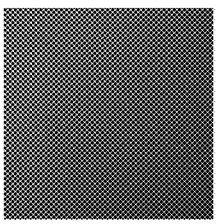

In the present invention, whether the moiré according to the randomness occurs or not was confirmed (area having the size of 3.5 cm×3.5 cm) based on the results thereof, and the results are shown in the following FIG. 8. That is, in the case where randomness is 70% or more, it was confirmed that the moiré avoidance effect was exhibited over the full range of the moiré.

The conducting substrate and the touch screen comprising the same according to the present invention may not block a view, have excellent conductivity, reduce a reflective diffraction phenomenon by a point light source, and prevent a reduction in display image quality by a moiré phenomenon. In addition, since the electric conducting pattern according to the present invention can be formed by various methods such as an indirect printing method, a photolithography method, a photography method, a method using a hard mask, or a sputtering method after a desired pattern is previously set, the process is easily performed and the cost is low. Further, in the case where the electric conducting pattern according to the present invention is used, it is possible to control randomness and transmittance by artificially controlling randomness and the like when an irregular pattern is designed, and the regular patterns having the same pitch and linear densities per unit area are similar regardless of randomness, such that it is possible to ensure electric uniformity similar to that of the regular pattern.

The invention claimed is:

1. A conducting substrate, comprising:
a board; and
an electric conducting pattern provided on at least one surface of the board,
wherein the electric conducting pattern comprises a border structure of continuously connected closed figures,
wherein a number of vertexes of the closed figures is 1.9 to 2.1 times larger than a number of vertexes of quadrangles, where the number of the quadrangles are the same as the number of the closed figures,
wherein when an image of a transmission type diffraction pattern is obtained by radiating straight light emitted from a light source to the electric conducting pattern on the conducting substrate, the image has a value of the following Equation 2 of less than 21, (standard deviation of intensities of the transmission type diffraction patterns according to an angle region / an average of intensity of the transmission type diffraction pattern according to the angle region)×100    [Equation 2]

wherein the angle region is a region where 0 to 360° are divided every 10° from a center of the image of the transmission type diffraction pattern.

2. The conducting substrate according to claim 1, wherein the closed figures have the value of the following Equation 1 of 50 or more:

(standard deviation of the distances between the vertexes / average of the distances between the vertexes)×100.    [Equation 1]

3. The conducting substrate according to claim 1, wherein when angles of lines constituting a border of the closed figures to a predetermined straight line are divided from 0 to 180° in a unit of 10°, a value of the following Equation 3 is less than 21 with respect to the number of lines belonging to each angle range:

(standard deviation of numbers of lines corresponding to the angle range / average of the numbers of the lines corresponding to the angle range)×100.    [Equation 3]

4. The conducting substrate according to claim 1, wherein the electric conducting pattern has a shape of the border structure of the closed figures obtained by after disposing predetermined points in regularly arranged unit cells, connecting the points to the closest points thereto as compared to the distances from other points.

5. The conducting substrate according to claim 4, wherein randomness to disposal of the points in the regularly arranged unit cells is 70% or more.

6. The conducting substrate according to claim 1, wherein the electric conducting pattern is a single film or a multilayered film comprising gold, silver, aluminum, copper, neodymium, molybdenum, nickel, or an alloy thereof.

7. The conducting substrate according to claim 1, wherein a line width of the electric conducting pattern is 10 μm or less, and the electric conducting pattern has the number of the vertexes of the closed figures of 6,000 to 245,000 in an area of 3.5 cm×3.5 cm.

8. The conducting substrate according to claim 1, wherein a line width of the electric conducting pattern is 7 μm or less, and the electric conducting pattern has the number of the vertexes of the closed figures of 7,000 to 62,000 in an area of 3.5 cm×3.5 cm.

9. The conducting substrate according to claim 1, wherein a line width of the electric conducting pattern is 5 μm or less, and the electric conducting pattern has the number of the vertexes of the closed figures of 15,000 to 62,000 in an area of 3.5 cm×3.5 cm.

10. The conducting substrate according to claim 1, wherein a line width of the electric conducting pattern is 10 μm or less and a thickness thereof is 10 μm or less.

11. The conducting substrate according to claim 1, wherein a line width of the electric conducting pattern is 7 μm or less and a thickness thereof is 1 μm or less.

12. The conducting substrate according to claim 1, wherein a line width of the electric conducting pattern is 5 μm or less and a thickness thereof is 0.5 μm or less.

13. The conducting substrate according to claim 1, wherein an opening ratio of the electric conducting pattern is 70% or more.

14. The conducting substrate according to claim 1, further comprising:
a darkening layer provided on at least one surface of the electric conducting pattern and in a region corresponding to the electric conducting pattern.

15. The conducting substrate according to claim 14, wherein total reflectance of a pattern region formed of the darkening layer and the electric conducting pattern, which is measured from a surface from which the darkening layer of the conducting substrate is visible, is 17% or less based on external light of 550 nm.

16. A touch screen, comprising:
an additional transparent board on the electric conducting pattern of the conducting substrate according to claim 1.

17. The touch screen according to claim 16, wherein the additional transparent board is reinforced glass or transparent plastic.

18. A display, comprising:
the touch screen of claim 16; and
a display module.

19. A conducting substrate, comprising:
a board; and
an electric conducting pattern provided on at least one surface of the board,
wherein the electric conducting pattern comprises a border structure of continuously connected closed figures,
wherein a number of vertexes of the closed figures is 1.9 to 2.1 times larger than a number of vertexes of polygons formed by connecting shortest distances between centers of the closed figures,
wherein when an image of a transmission type diffraction pattern is obtained by radiating straight light emitted from a light source to the electric conducting pattern on the conducting substrate, the image has a value of the following Equation 2 of less than 21, (standard deviation of intensities of the transmission type diffraction patterns according to an angle region / an average of intensity of the transmission type diffraction pattern according to the angle region)×100     [Equation 2]

wherein the angle region is a region where 0 to 360° are divided every 10° from a center of the image of the transmission type diffraction pattern.

20. A conducting substrate, comprising:
a board; and
an electric conducting pattern provided on at least one surface of the board,
wherein the electric conducting pattern comprises a border structure of continuously connected closed figures, and the closed figures have a value of the following Equation 1 of 50 or more:

(standard deviation of distances between vertexes / average of the distances between the vertexes)× 100,     [Equation 1]

wherein when an image of a transmission type diffraction pattern is obtained by radiating straight light emitted from a light source to the electric conducting pattern on the conducting substrate, the image has a value of the following Equation 2 of less than 21, (standard deviation of intensities of the transmission type diffraction patterns according to an angle region / an average of intensity of the transmission type diffraction pattern according to the angle region)×100     [Equation 2]

wherein the angle region is a region where 0 to 360° are divided every 10° from a center of the image of the transmission type diffraction pattern.

* * * * *